(12) United States Patent
Han

(10) Patent No.: US 12,388,444 B2
(45) Date of Patent: Aug. 12, 2025

(54) CURRENT MODE LOGIC CIRCUIT

(71) Applicant: IUCF-HYU (INDUSTRY-UNIVERSITY COOPERATION FOUNDATION HANYANG UNIVERSITY), Seoul (KR)

(72) Inventor: Jae Duk Han, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 259 days.

(21) Appl. No.: 17/922,907

(22) PCT Filed: Apr. 21, 2021

(86) PCT No.: PCT/KR2021/004994
§ 371 (c)(1),
(2) Date: Nov. 2, 2022

(87) PCT Pub. No.: WO2021/246641
PCT Pub. Date: Dec. 9, 2021

(65) Prior Publication Data
US 2023/0170904 A1    Jun. 1, 2023

(30) Foreign Application Priority Data
Jun. 5, 2020 (KR) .................. 10-2020-0068655

(51) Int. Cl.
*H03K 19/003* (2006.01)
*H03K 3/354* (2006.01)
(Continued)

(52) U.S. Cl.
CPC ....... *H03K 19/00384* (2013.01); *H03K 3/354* (2013.01); *H03K 19/0013* (2013.01); *H03K 19/018514* (2013.01)

(58) Field of Classification Search
CPC ............... H03K 3/354; H03K 19/0013; H03K 19/00384; H03K 19/018514
See application file for complete search history.

(56) References Cited

U.S. PATENT DOCUMENTS 6,069,522 A * 5/2000 Venkatraman ........ H03F 3/4508
327/52
8,200,179 B1 * 6/2012 Mosinskis ......... H04L 25/03254
455/240.1
(Continued)

FOREIGN PATENT DOCUMENTS

JP      09-501552 A      2/1997
KR   10-2007-0034177 A   3/2007

OTHER PUBLICATIONS

International Search Report of PCT/KR2021/004994 dated Aug. 4, 2021 [PCT/ISA/210].

*Primary Examiner* — Seokjin Kim
(74) *Attorney, Agent, or Firm* — Sughrue Mion, PLLC

(57) ABSTRACT

According to an aspect, a current mode logic circuit comprise a first trim resistor and a second trim resistor connected to a supply voltage, a first transistor connected to an input voltage, a second transistor connected to an inverted input voltage and a third transistor and a fourth transistor connected to the first transistor and the second transistor, respectively, in a cascode manner in order to control magnitudes of an output voltage and an inverted output voltage of the current mode logic circuit.

7 Claims, 13 Drawing Sheets

(51) Int. Cl.
*H03K 19/00* (2006.01)
*H03K 19/0185* (2006.01)

(56) References Cited

U.S. PATENT DOCUMENTS

| | | | |
|---|---|---|---|
| 2013/0159759 A1* | 6/2013 | Yeung | G06F 13/4295 |
| | | | 713/401 |
| 2015/0002205 A1* | 1/2015 | Maeda | H03K 19/09432 |
| | | | 327/332 |
| 2016/0164558 A1* | 6/2016 | Elzeftawi | H03L 7/099 |
| | | | 455/192.1 |
| 2018/0083624 A1* | 3/2018 | Tang | H03K 19/018514 |

* cited by examiner

[FIG. 1]
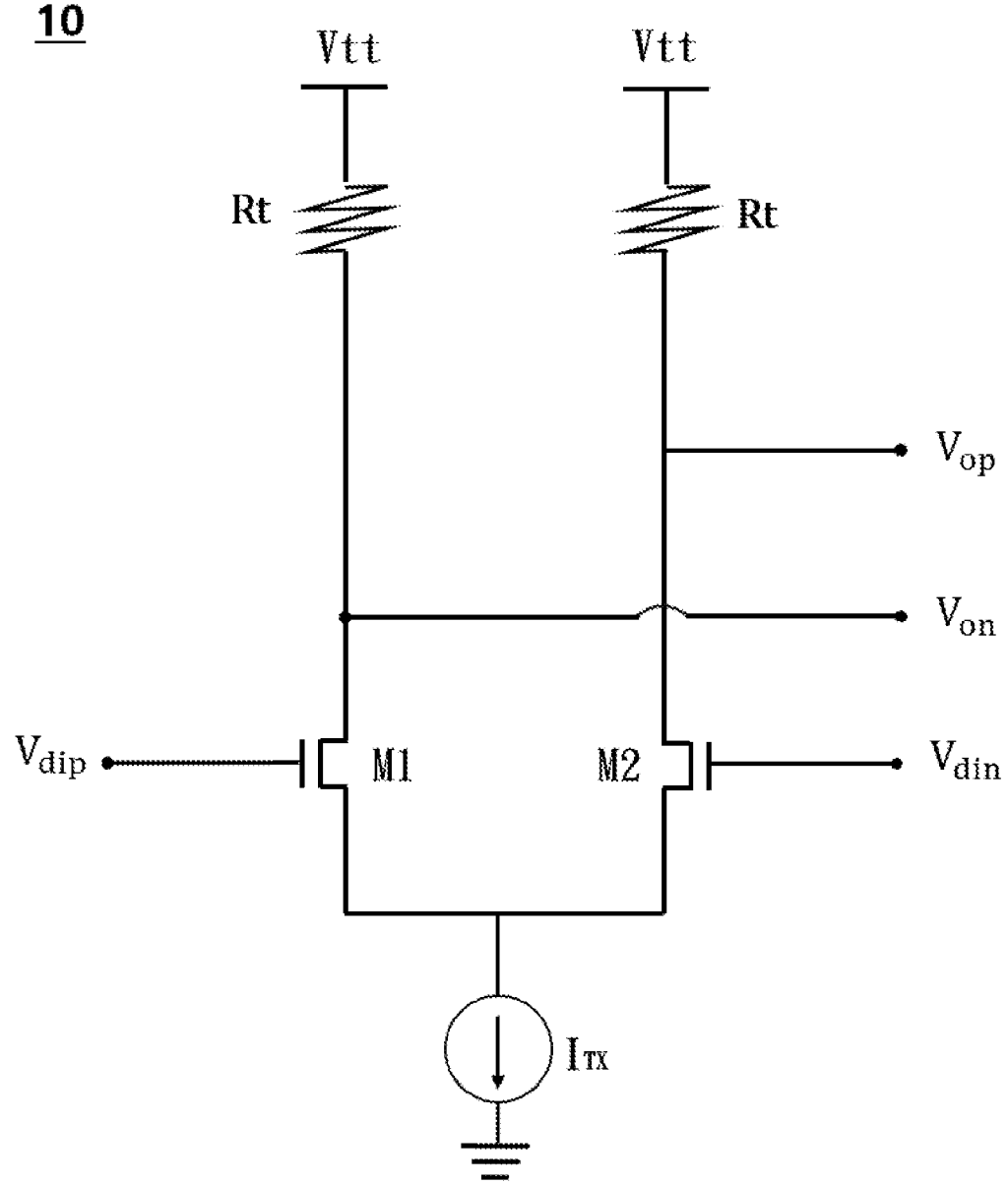

[FIG. 2]
Input Voltage($V_{dip}$) = $V_{dd}$
Inverted Input Voltage($V_{din}$) = 0
Output Voltage($V_{op}$) = $V_{tt} - I_{tx} \times R_t$
Inverted Output Voltage($V_{on}$) = $V_{tt}$
Input Voltage($V_{dip}$) = 0
Inverted Input Voltage($V_{din}$) = $V_{dd}$
Output Voltage($V_{op}$) = $V_{tt}$
Inverted Output Voltage($V_{on}$) = $V_{tt} - I_{tx} \times R_t$

[FIG. 3]
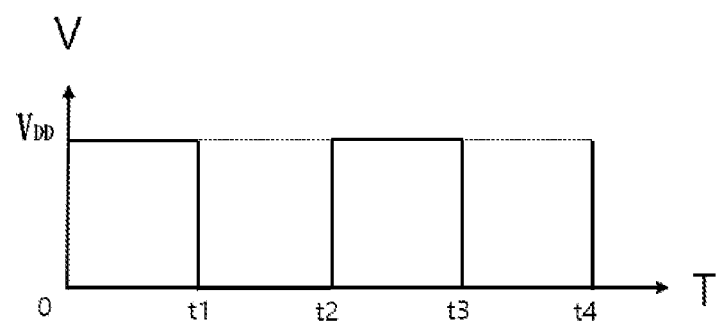
Waveform of $V_{dip}$
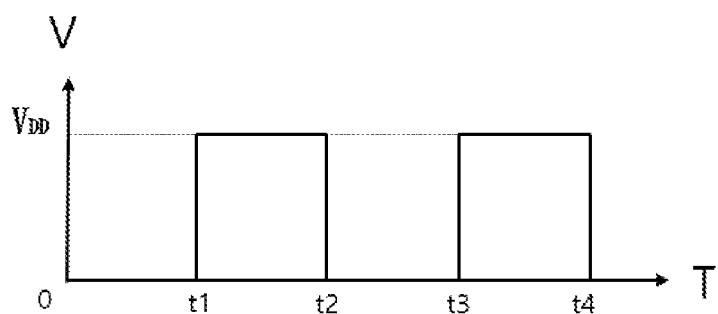
Waveform of $V_{din}$

[FIG. 4]
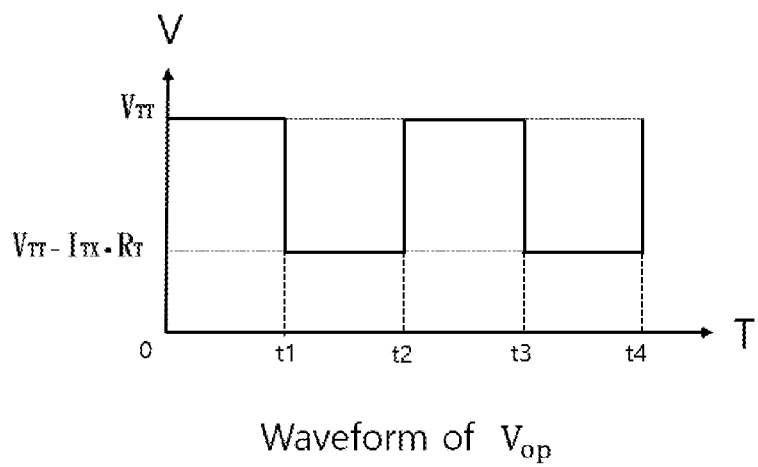
Waveform of $V_{op}$
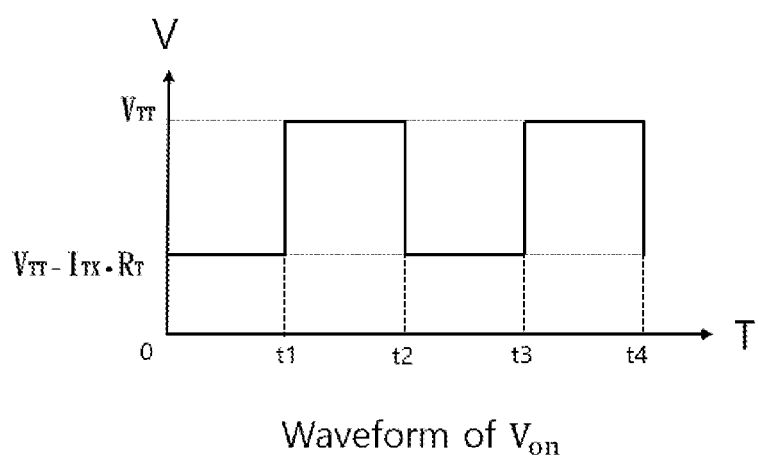
Waveform of $V_{on}$

[FIG. 5]
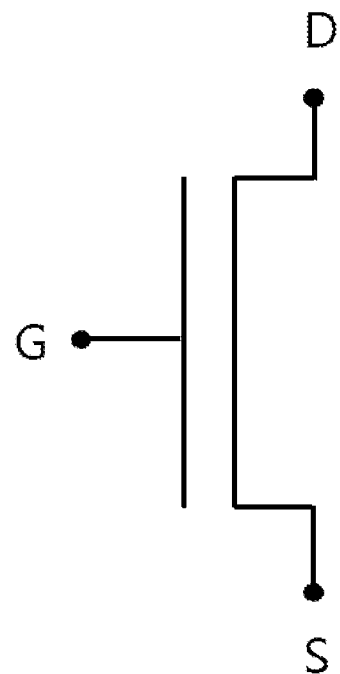
- $V_{gs} < V_{break}$
- $V_{dg} < V_{break}$

[FIG. 6]
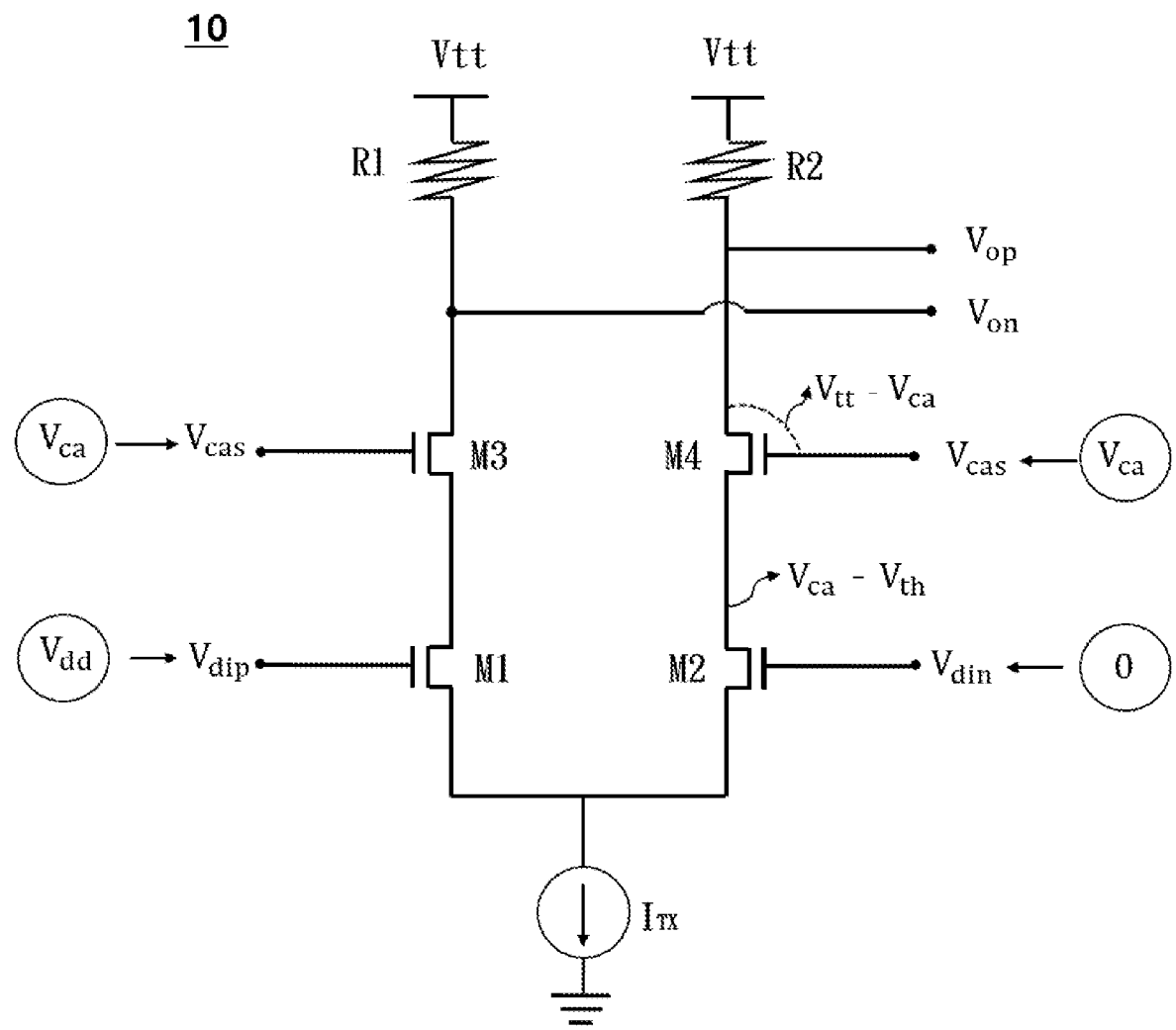

[FIG. 7]
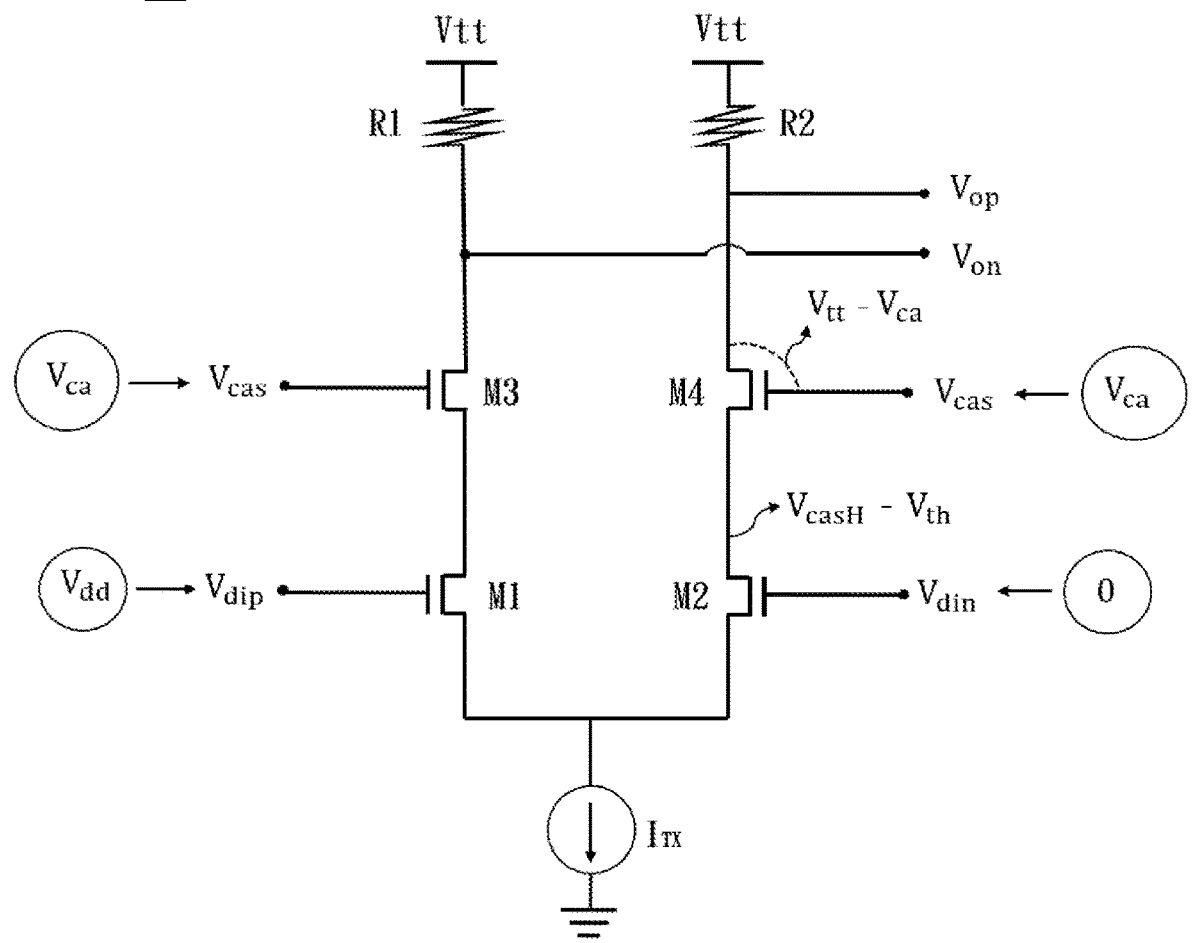

[FIG. 8]
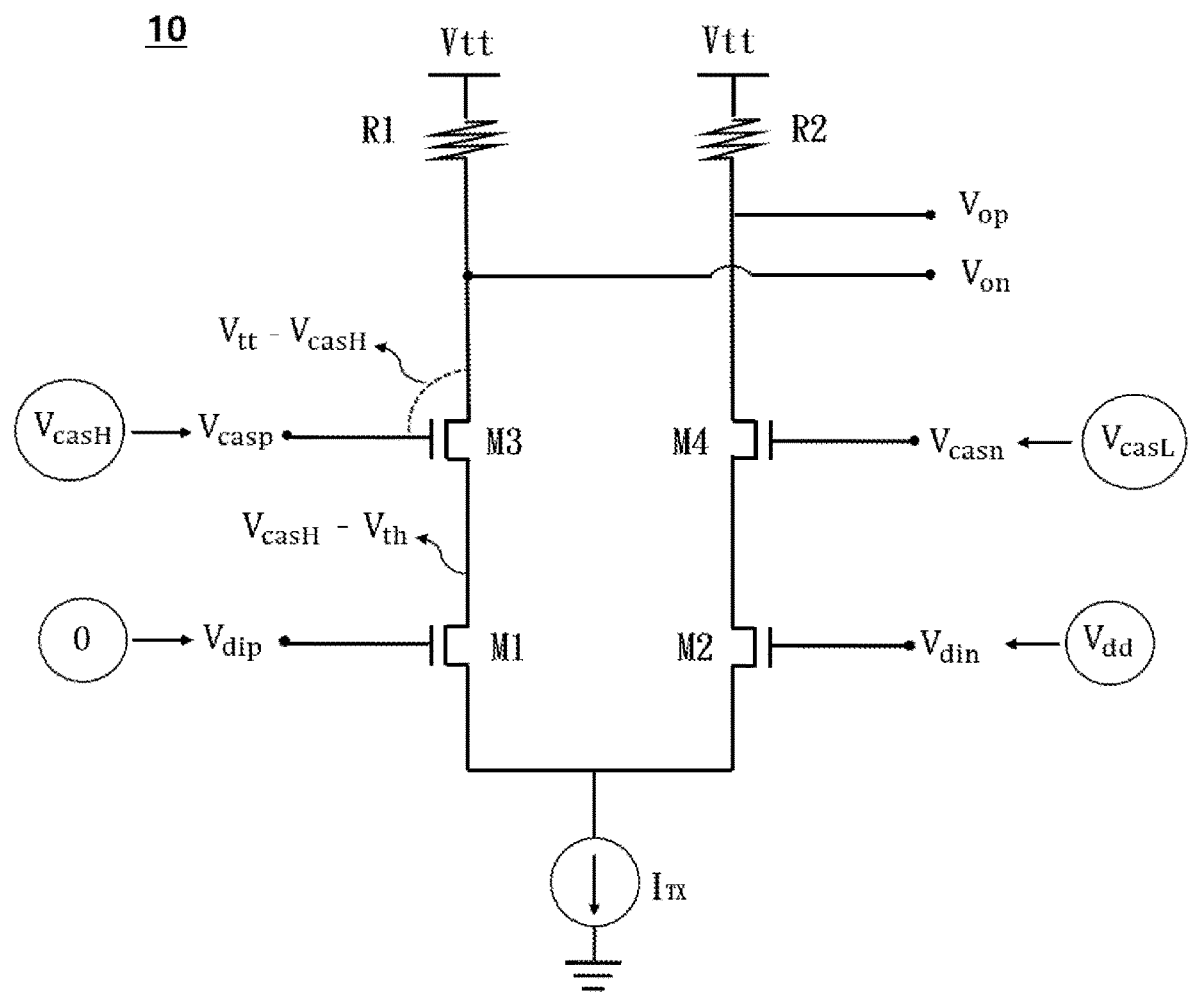

[FIG. 9]
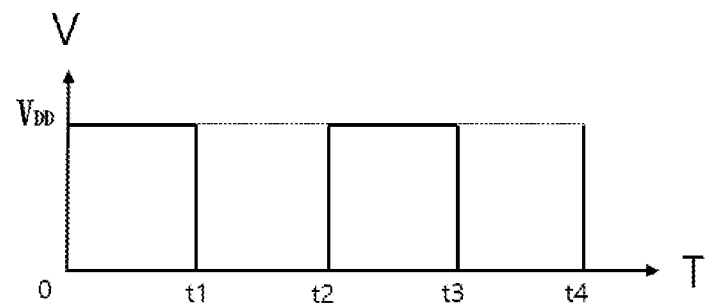
Waveform of $V_{dip}$
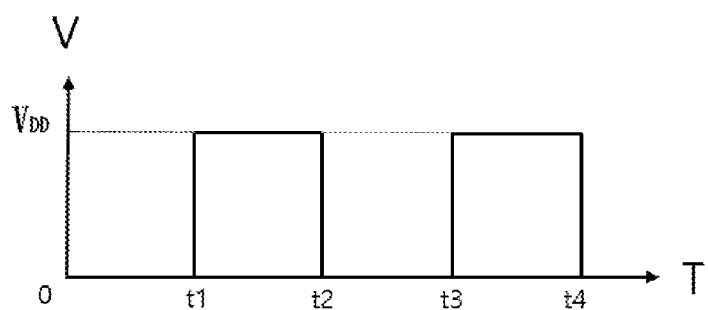
Waveform of $V_{din}$

[FIG. 10]
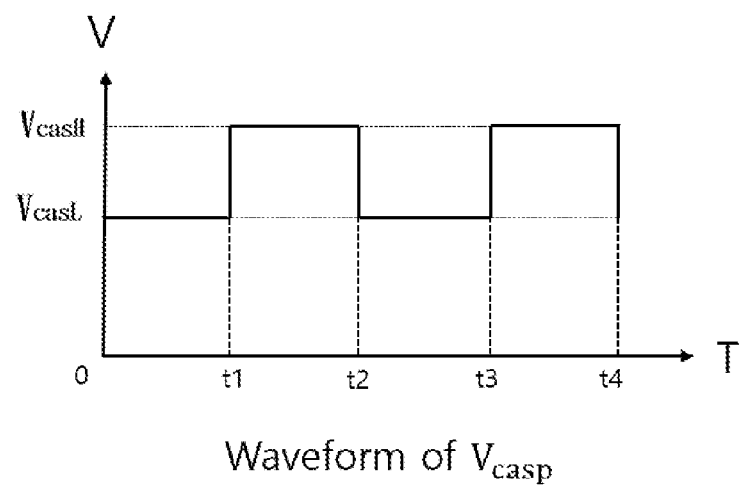
Waveform of $V_{casp}$
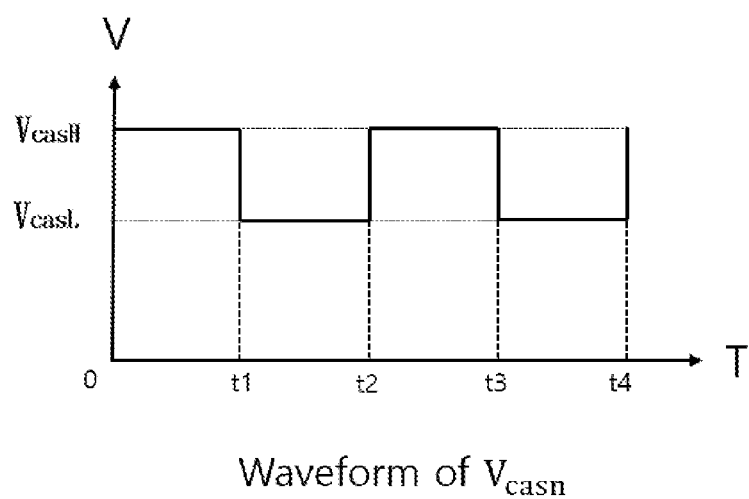
Waveform of $V_{casn}$

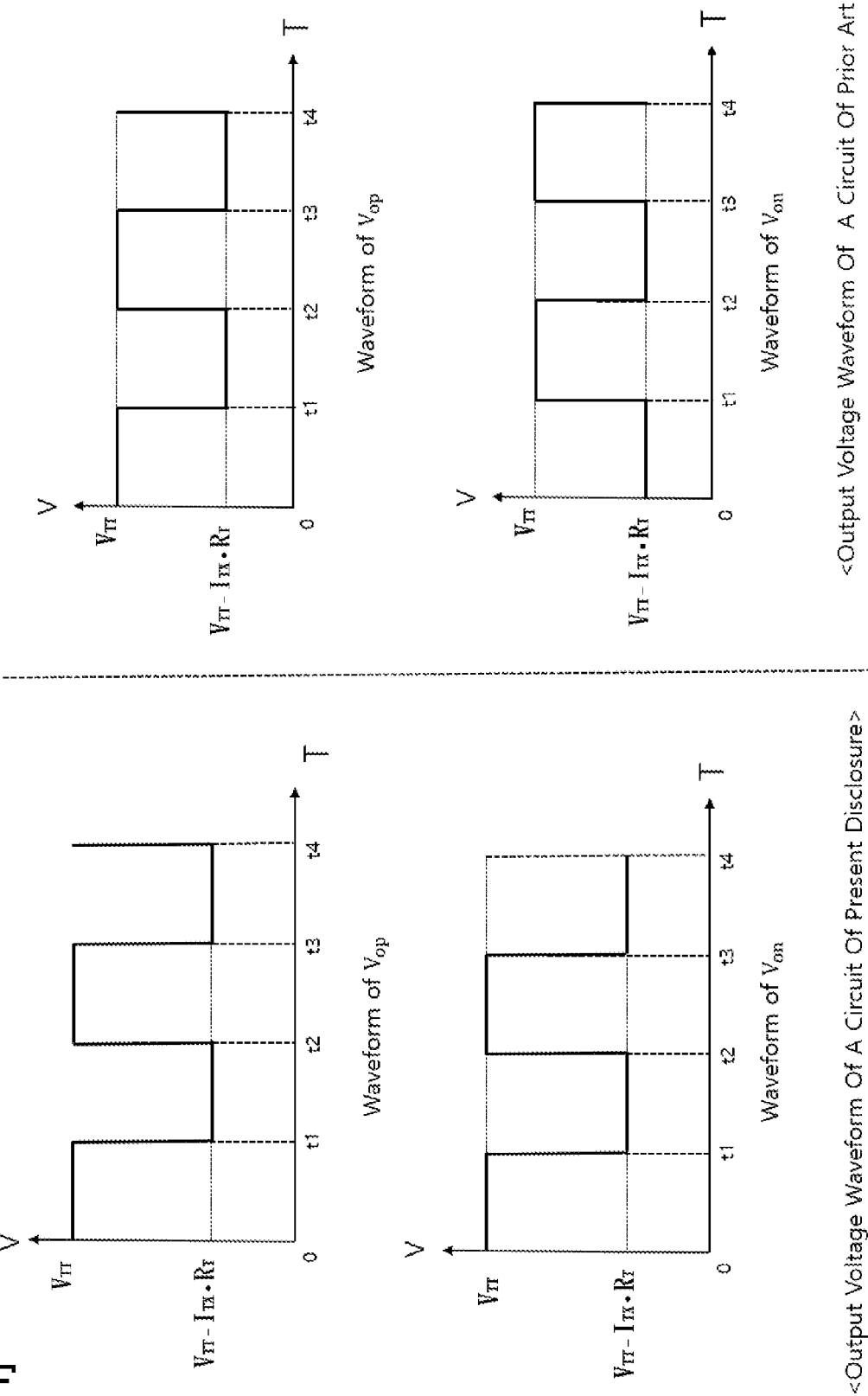
[FIG. 11]

[FIG. 12]
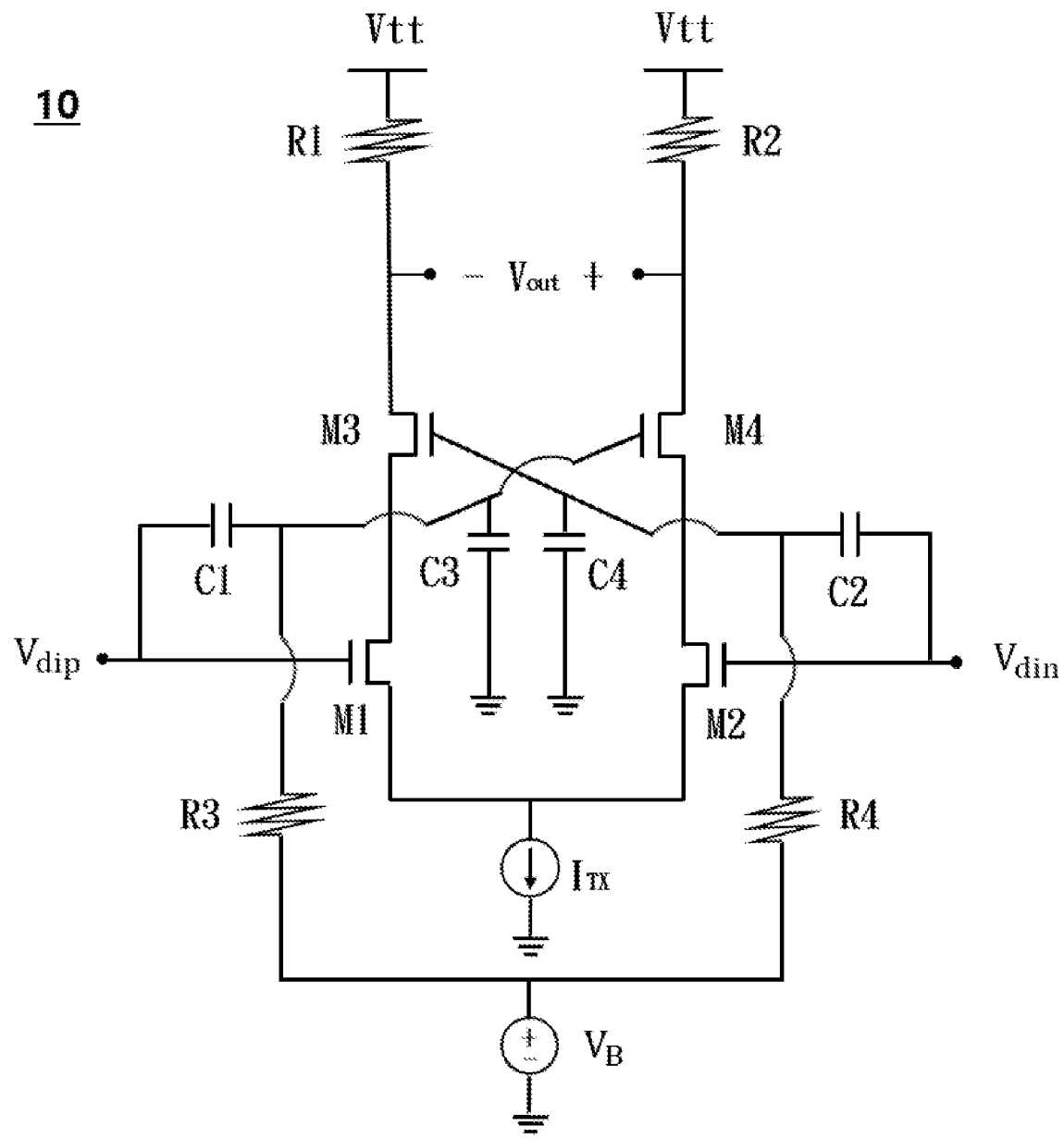

[FIG. 13]
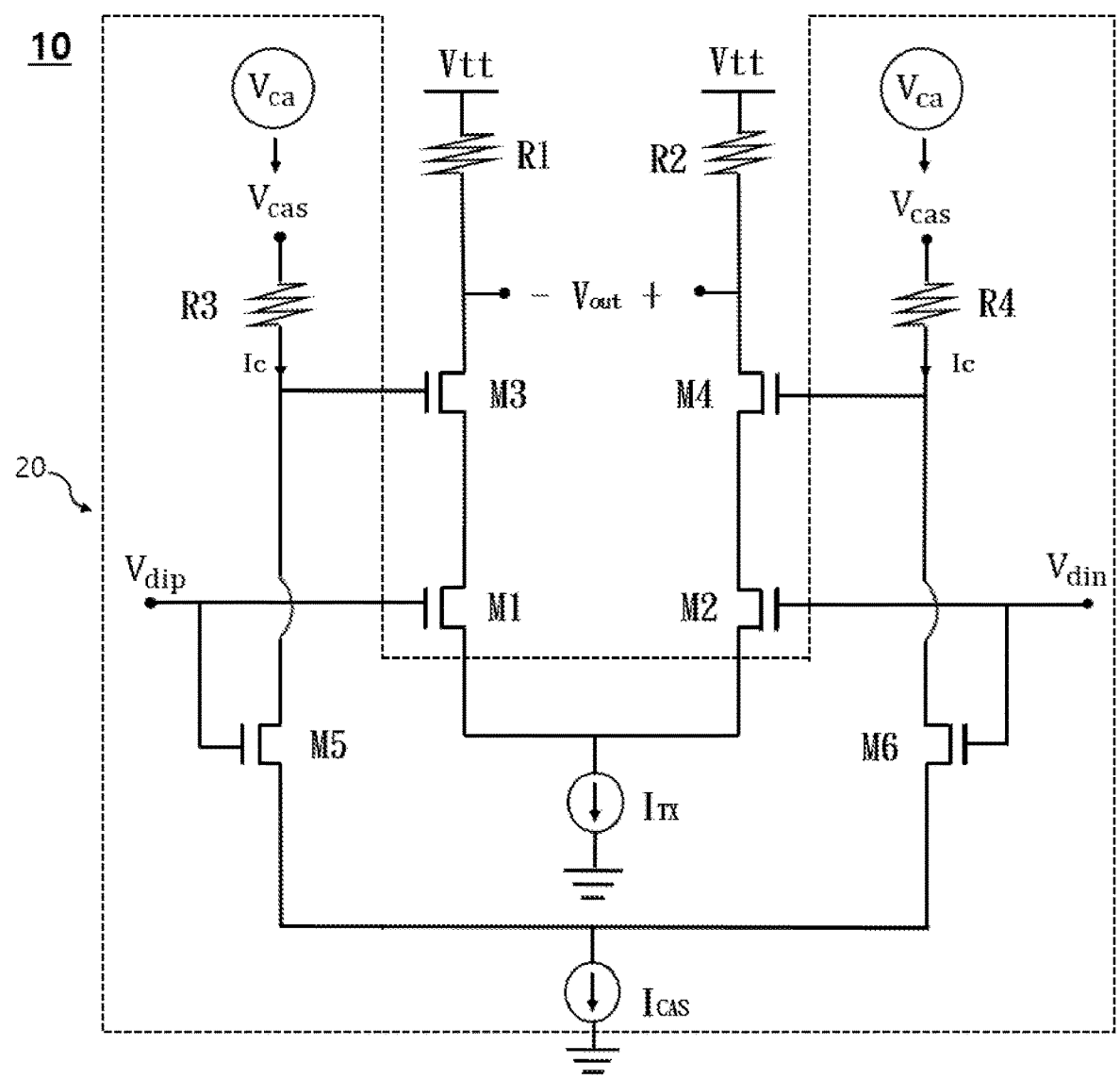

CURRENT MODE LOGIC CIRCUIT

This application claims the benefit of PCT Application No. KR2021/004994, filed on Apr. 21, 2021 in the Korean Intellectual Property Office, the disclosure of which is incorporated herein by reference.

FIELD OF THE DISCLOSURE

Background

A current mode logic circuit is a kind of semiconductor logic device, and refers to an unsaturated high-speed logic circuit constructed using differentially connected current switches.

High-speed operation signal processing circuits are realized using a technique called current mode logic (CML), and are generally configured in the form of using a resistance device as a load in a differential amplifier, and thus, have the advantage of being able to achieve a higher operating speed than the CMOS (complementary metal-oxide semiconductor) method in which NMOS (n-channel metal oxide semiconductor) or PMOS (N-channel metal oxide semiconductor) devices are connected in pairs.

In addition, the current mode logic circuit has an advantage in terms of noise as well because it can be transmitted as a differential signal. Therefore, the current mode logic is used for most of the integrated circuits of gigahertz bands constituting a device requiring a high-speed operation to support a 10 Gbps class GPON (gigabit-capable passive optical network).

The output voltage level of a current mode logic circuit has the characteristic of being variable according to the voltage applied to the drain node of the differential transistor. Therefore, when it is desired to increase the output voltage of the current mode logic circuit, the magnitude of the voltage applied to the drain node of the differential transistor is generally increased.

But if the magnitude of the voltage applied to the drain node of the transistor is continuously increased in order to increase the level of the output voltage, the voltage range in which the transistor device can operate normally is exceeded, resulting in a problem that the transistor device breaks down, and it has thus been common to design the level of the input voltage applied to the transistor to be within the range in which the transistor device does not break down.

However, as transistor sizes get smaller with the development of technologies and accordingly, the durability of devices deteriorates, the magnitude of the voltage that can be applied to the drain node will inevitably continue to decrease, which has caused a problem that the level of the output voltage of the current mode logic circuit drops.

In other words, it was relatively easier to obtain a high output voltage as a high voltage of about 1.8 V could be applied to the drain node of the transistor in the past, but since a voltage of 0.8 V or less is applied to the drain node of the transistor in order to operate the device stably these days, there is a problem that the output voltage of the current mode logic circuit decreases.

SUMMARY OF THE DISCLOSURE

Technical Objects

Therefore, a current mode logic circuit in accordance with one embodiment is designed to solve the problems described above, and it is intended to provide a current mode logic circuit capable of stably increasing the width of an output voltage of the current mode logic circuit without causing a transistor device to break down even if an input voltage is increased in the current mode logic circuit.

According to an aspect, a current mode logic circuit comprise a first trim resistor and a second trim resistor connected to a supply voltage, a first transistor connected to an input voltage, a second transistor connected to an inverted input voltage and a third transistor and a fourth transistor connected to the first transistor and the second transistor, respectively, in a cascode manner in order to control magnitudes of an output voltage and an inverted output voltage of the current mode logic circuit.

The third transistor may be arranged between the first trim resistor and the first transistor, and the fourth transistor is arranged between the second trim resistor and the second transistor.

The current mode logic circuit may further comprise a control unit configured to control the magnitudes of the supply voltage, the input voltage and the inverted input voltage, and voltages supplied to the third transistor and the fourth transistor of the current mode logic circuit and the control unit may control the magnitudes of the output voltage and the inverted output voltage of the current mode logic circuit by controlling the magnitudes of the voltages supplied to the third transistor and the fourth transistor.

The control unit may control individually the magnitude of the voltage supplied to the third transistor and the magnitude of the voltage supplied to the fourth transistor to be different from each other with time.

The control unit may control the magnitude of the voltage supplied to the fourth transistor to be a low voltage if the magnitude of the voltage supplied to the third transistor is a high voltage, and controls the magnitude of the voltage supplied to the fourth transistor to be a high voltage if the magnitude of the voltage supplied to the third transistor is a low voltage.

The control unit may control individually the voltage supplied to the third transistor and the voltage supplied to the fourth transistor in correspondence to the magnitudes of the voltages supplied to the input voltage and the inverted input voltage.

The control unit may control the magnitude of the voltage supplied to the third transistor to be smaller than the magnitude of the voltage supplied to the fourth transistor if the magnitude of the voltage supplied to the first transistor is greater than the magnitude of the voltage supplied to the second transistor.

The control unit may control the magnitude of the voltage supplied to the third transistor to be greater than the magnitude of the voltage supplied to the fourth transistor if the magnitude of the voltage supplied to the first transistor is smaller than the magnitude of the voltage supplied to the second transistor.

The control unit may input a low voltage to the third transistor and a high voltage to the fourth transistor if a voltage is inputted to the first transistor and no voltage is inputted to the second transistor.

The control unit may input a high voltage to the third transistor and a low voltage to the fourth transistor if no voltage is inputted to the first transistor and a voltage is inputted to the second transistor.

According to another aspect, a current mode logic circuit may comprise a first trim resistor and a second trim resistor connected to a supply voltage, a first transistor connected to an input voltage, a second transistor connected to an inverted input voltage and a third transistor and a fourth transistor connected to the first transistor and the second transistor, respectively, in a cascode manner and the third transistor is connected to the inverted input voltage, and the fourth transistor is connected to the input voltage.

The current mode logic circuit may further comprise a second AC coupling capacitor connected to the third transistor and the inverted input voltage, and a first AC coupling capacitor connected to the fourth transistor and the input voltage.

The capacitances of the first AC coupling capacitor and the second AC coupling capacitor may be variable in correspondence to magnitudes of the input voltage and the inverted input voltage inputted to the third transistor and the fourth transistor.

According to other aspect, a current mode logic circuit may comprise a first trim resistor and a second trim resistor connected to a supply voltage, a first transistor connected to an input voltage, a second transistor connected to an inverted input voltage, a third transistor and a fourth transistor connected to the first transistor and the second transistor, respectively, in a cascode manner and a differential amplifier circuit comprising a third trim resistor, a fourth trim resistor, a fifth transistor, and a sixth transistor, and the fifth transistor is connected to the input voltage, and the sixth transistor is connected to the inverted input voltage.

The voltage inputted to the third transistor may be variable in conjunction with a voltage outputted from the input voltage, and a voltage inputted to the fourth transistor is variable in conjunction with a voltage outputted from the inverted input voltage.

Effects of the Invention

The current mode logic circuit in accordance with one embodiment can stably drive a transistor unlike the prior art even if the drive voltage of the circuit is increased, and thus, has an advantage of being able to widen the output swing width of the circuit. Accordingly, there is an effect of being able to improve the output signal and the signal-to-noise ratio (SNR) of the current mode logic circuit, thereby reducing the influence of noise and interference.

BRIEF DESCRIPTION OF THE DRAWINGS

FIG. 1 is a circuit diagram showing the structure of a current mode logic circuit in accordance with the prior art.

FIG. 2 is a diagram showing the equations of an input voltage and an inverted input voltage inputted to the current mode logic circuit and the equations of an output voltage and an inverted output voltage outputted from the current mode logic circuit in accordance with the prior art.

FIG. 3 shows plots illustrating the input voltage and the inverted input waveform over time in the current mode logic circuit in accordance with the prior art.

FIG. 4 shows plots illustrating the voltage waveforms according to outputted times in the output voltage and the inverted output voltage in the current mode logic circuit in accordance with the prior art.

FIG. 5 is a diagram for describing a gate-oxide breakdown phenomenon of a transistor.

FIG. 6 is a circuit diagram showing the structure of a current mode logic circuit in accordance with one embodiment.

In FIGS. 7 and 8, as diagrams showing voltages inputted in a current mode logic circuit in accordance with another embodiment.

FIG. 9 shows plots illustrating waveforms of an input voltage and an inverted input voltage over time in a current mode circuit in accordance with another embodiment.

FIG. 10 shows plots illustrating waveforms of voltages over time inputted to cascode transistors in a current mode logic circuit in accordance with another embodiment.

FIG. 11 shows plots that compare and illustrate the output voltages of a current mode logic circuit in accordance with one embodiment and a current mode logic circuit in accordance with the prior art.

FIG. 12 is a circuit diagram showing the configuration of a current mode logic circuit 10 in accordance with another embodiment.

FIG. 13 is a circuit diagram showing the configuration of a current mode logic circuit in accordance with one embodiment.

DETAILED DESCRIPTION OF THE PREFERRED EMBODIMENTS

Hereinafter, embodiments according to the present invention will be described with reference to the accompanying drawings. In adding reference numerals to constituent elements of each drawing, it should be noted that the same constituent elements are denoted by the same reference numeral even if they are illustrated on different drawings. In describing the embodiments of the present invention, a detailed description of pertinent known constructions or functions will be omitted if it is deemed to make the gist of the embodiments the present invention unnecessarily vague. In addition, the embodiments of the present invention will be described below, but the technical idea of the present invention is not limited thereto or is not restricted thereto, and may be variously realized by being modified by those skilled in the art.

In addition, terms used in the present specification are used only in order to describe embodiments rather than limiting or restricting the present invention. Singular forms are intended to include plural forms unless the context clearly indicates otherwise.

In the present specification, it should be understood that the term "include", "comprise", or "have" indicates that a feature, a number, a step, an operation, a constituent element, a part, or a combination thereof described in the specification is present, but does not exclude a possibility of presence or addition of one or more other features, numbers, steps, operations, constituent elements, parts, or combinations, in advance.

In addition, throughout the specification, when it is described that an element is "connected" to another element, this includes not only being "directly connected", but also being "indirectly connected" with another element in between, and terms including ordinal numbers such as first, second, and the like used in the present specification will be used only to describe various elements, and are not to be interpreted as limiting these elements.

The present invention will be described more fully hereinafter with reference to the accompanying drawings, in which embodiments of the invention are shown. In the drawings, parts irrelevant to the description are omitted in order to clearly describe the present invention.

Furthermore, the title of the invention is a method and apparatus for providing a document editing interface for providing resource information related to a document using a backlink button. For convenience of explanation, however, in the specification below, an apparatus for providing a document editing interface for providing resource information associated with a document using a backlink button is referred to as a document editing interface providing apparatus in its description. The meaning of 'clicking' throughout the document is used to refer to the user requesting an execution command for the button, and as a common term, it may refer to executing a command by clicking a mouse or using a specific key on a keyboard in a PC environment, and tapping by a user's touch consecutively or for a certain period of time in a mobile environment.

FIG. 1 is a circuit diagram showing the structure of a current mode logic circuit in accordance with the prior art, and FIG. 2 is a diagram showing the equations of an input voltage and an inverted input voltage inputted to the current mode logic circuit and the equations of an output voltage and an inverted output voltage outputted from the current mode logic circuit in accordance with the prior art. FIG. 3 shows plots illustrating the input voltage and the inverted input waveform over time in the current mode logic circuit in accordance with the prior art, FIG. 4 shows plots illustrating the voltage waveforms according to outputted times in the output voltage and the inverted output voltage in the current mode logic circuit in accordance with the prior art, and FIG. 5 is a diagram for describing a gate-oxide breakdown phenomenon of a transistor.

Referring to FIGS. 1 to 4, if the input voltage Vdip and the inverted input voltage Vdin are inputted at Vdd V and 0 V in the current mode logic circuit in accordance with the prior art, the output voltage Vop and the inverted voltage output Von of the current mode logic circuit are outputted at Vtt−Itx*Rt V and VTT V. Conversely, if the input voltage and the inverted input voltage are inputted at 0 V and VDD V, the output voltage Vop and the inverted voltage output Von of the current mode logic circuit are outputted at Vtt V and Vtt−Itx*Rt V.

The reason that the output voltage of the circuit is not in the range of 0 to Vtt V is that a first transistor M1 and a second transistor M2, which are differential transistors, must operate in the saturation region due to the characteristics of the current mode logic circuit, and the current source Itx must also be driven at the same time, which requires a constant voltage, and thus, the output voltage and inverted output voltage of the current mode circuit are outputted not at 0 to Vtt V but at lower Vtt−Itx*Rt to Vtt V.

And the output width (swing) in the current mode logic circuit can be defined as the difference between the output voltage and the inverted output voltage. In other words, since the difference between the value where the level of the output voltage is high and the value where the level of the output voltage is low can be defined as the width of the output, the width of the output in the current mode logic circuit as shown in FIG. 1 is equal to Itx*Rt.

And in general, in the case of a current mode logic circuit, the width of the output gets smaller than that of a circuit realized with CMOS due to its characteristics, which causes a lot of difficulties in driving the current mode logic circuit at high speed while maintaining a high voltage in an environment with high noise or interference. Therefore, if it is desired to widen the width of the output in the current mode logic circuit, the width of the output of the circuit is widened by a method of increasing the magnitude of Vtt, which is the drive voltage.

However, in a generic transistor, a voltage range in which the transistor can operate normally without being stressed is set. Accordingly, indiscriminately increasing the magnitude of the voltage of the drive power source may possibly cause an overload in the transistor, thereby resulting in a problem of breaking down the device.

Specifically, in the case of an NMOS transistor as shown in FIG. 5, if the gate-source voltage Vgs or the drain-gate voltage Vdg is higher than a certain voltage, the device cannot withstand the voltage, and thus, a gate-oxide breakdown phenomenon occurs.

Therefore, when manufacturing a circuit in general, the bias voltage applied to the transistor is controlled not to exceed a certain level so as not to break down the device, and since devices become more sensitive to voltage stress as processes become more miniaturized with the development of technologies, the magnitude of the maximum voltage applied to the transistor tends to get lower.

By the way, in the case of a current mode logic circuit, the method of increasing the magnitude of the drive voltage as described above is the most efficient in order to increase the output swing, but if the magnitude of the drive voltage is continuously increased, the drain-gate voltage Vdg value of the input transistors gets even higher.

In other words, if the magnitude of the voltage across the gate of the transistor continues to increase, the limit operating voltage range Vbreak that the device can withstand is exceeded, and thus, the gate-oxide breakdown phenomenon described above may occur.

Therefore, in the case of determining the output swing width by increasing the drive voltage in the current mode logic circuit, the width of the output is determined by the method of setting the limit value first so that the transistor device does not break down and then of determining the magnitude of the input voltage based on this, and thus, there have been many restrictions on circuit design.

Accordingly, as a method for solving this problem, a method of applying a low input voltage level of a current mode logic circuit at a little higher value Vlow rather than 0 V has been proposed.

In other words, in the case that Vdd V is inputted to the input voltage in the circuit shown in FIG. 1, if the magnitudes of the voltages inputted to the circuit are controlled so that a voltage Vlow of a value slightly higher than 0 V rather than 0 V is inputted to the inverted input voltage unlike in FIG. 2, a small voltage is applied to the gate of the transistor by that amount, and thus, the transistor can be driven stably without being broken down and at the same time, the drive voltage can be increased by the amount of Vlow voltage.

However, if the voltage Vlow is continuously increased in proportion in order to increase the drive voltage a lot, the transistors are not completely turned off even at a low input voltage, and thus, there is a problem that power loss occurs.

Therefore, a current mode logic circuit 10 in accordance with one embodiment is designed to solve all of these problems, and is designed to provide a current mode logic circuit that can widen the width of the output of the current mode logic circuit by increasing the drive voltage of the current mode logic circuit and that can stably drive a transistor without breaking it down by controlling the magnitudes of input voltages over time. Hereinafter, various embodiments of the present disclosure will be discussed with reference to the drawings.

FIG. 6 is a circuit diagram showing the structure of a current mode logic circuit 10 in accordance with one embodiment.

Referring to FIG. 6, a current mode logic circuit 10 in accordance with one embodiment may include a first trim resistor R1 and a second trim resistor R2 connected to a supply voltage Vtt, a first transistor M1 connected to an input voltage Vdip, a second transistor M2 connected to an inverted input voltage Vdin, and a third transistor M3 and a fourth transistor M4 connected to the first transistor M1 and the second transistor M2, respectively, in a cascode manner in order to control the magnitudes of an output voltage Vop and an inverted output voltage Von of the current mode logic circuit 10, the third transistor M3 may be arranged between the first trim resistor R1 and the first transistor M1, and the fourth transistor M4 may be arranged between the second trim resistor R2 and the second transistor M2.

In addition, the current mode logic circuit 10 may include a control unit (not shown) capable of adjusting any kind of voltages (the input voltage, the inverted input voltage, and cascode input voltages) inputted to the current mode logic circuit 10, though not shown in the drawing.

If the circuit is configured as shown in FIG. 6, since the third transistor M3 and the fourth transistor M4 are respectively connected to the first transistor M1 and the second transistor M2, which correspond to the differential transistors, in a cascode manner, they may serve to reduce the magnitudes of the voltages loaded to the first transistor M1 and the second transistor M2. In other words, the third transistor M3 and the fourth transistor M4 may serve to protect the first transistor M1 and the second transistor M2 by the amount of the magnitudes of the reduced voltages.

Specifically, looking into this in terms of the magnitudes of voltages, when voltage VDD V is inputted to the input voltage, 0 V is inputted to the inverted input voltage, voltage Vca V is inputted to the third transistor M3 input voltage Vcas, and voltage Vca V is inputted to the input voltage Vcas of the fourth transistor M4, as shown in FIG. 6, the drain-gate voltage of the fourth transistor M4 is not equal Vtt V, which is the drive voltage, but equal to Vtt–Vca V. Accordingly, since a voltage margin is produced by the amount of the voltage Vca V, there is an effect of being able to further increase the drive voltage by the amount of the voltage Vca V.

In FIGS. 7 and 8, as diagrams showing voltages inputted in a current mode logic circuit in accordance with another embodiment, FIG. 9 shows plots illustrating waveforms of an input voltage and an inverted input voltage over time in a current mode circuit in accordance with another embodiment, and FIG. 10 shows plots illustrating waveforms of voltages over time inputted to cascode transistors in a current mode logic circuit in accordance with another embodiment. FIG. 11 shows plots that compare and illustrate the output voltages of a current mode logic circuit in accordance with one embodiment and a current mode logic circuit in accordance with the prior art.

In the case of the current mode logic circuit 10 in accordance with FIG. 7, the circuit configuration is the same as the circuit shown in FIG. 6, but has a feature different from the circuit of FIG. 6 in that the magnitudes of the voltages inputted to the third and fourth transistors M3 and M4 corresponding to the cascode transistors are variable with time.

Specifically, in the case of the current mode logic circuit 10 in accordance with FIG. 7, a control unit (not shown) that can control the magnitudes of the voltages inputted to the circuit may control individually the magnitudes of the voltages supplied to the third transistor M3 and the fourth transistor M4 to be different from each other with time, and may thus control the magnitudes of the output voltage and the inverted output voltage of the current mode logic circuit 10.

For example, as shown in FIG. 7, when an input voltage and an inverted input voltage are inputted at Vdd V and 0 V, VcasH V that is a high voltage is inputted as a cascode input voltage Vcasn inputted to the third transistor M3 that is a cascode transistor, and VcasL V that is a low voltage is inputted as a cascode inverted input voltage Vcasp inputted to the fourth transistor M4, the high voltage Vdd is inputted to the first transistor M1 and the low voltage VcasL is inputted to the third transistor M3, and accordingly, there is an effect of being able to widen the saturated operation region of the third transistor M3.

In addition, at the same time, since 0 V, the low voltage, is inputted to the second transistor M2 and the voltage VcasH higher than the voltage inputted to the third transistor M3 is inputted as the voltage inputted to the fourth transistor M4, the magnitude of the voltage inputted to the gate of the fourth transistor M4 can be reduced.

Therefore, the magnitude of the voltage at which the fourth transistor M4 can operate normally can be further secured relatively, thereby preventing the phenomenon of the transistor being broken down due to high voltages.

Conversely, as shown in FIG. 8, if the input voltage and the inverted input voltage are inputted at 0 V and VDD V, VcasL V that is a low voltage is inputted to the third transistor M3 that is a cascode transistor, and VcasH V that is a high voltage is inputted to the fourth transistor M4, then Vdd V, the high voltage, is inputted to the second transistor M2 and VcasL, the low voltage, is inputted to the fourth transistor M4, and thus, there is an advantage of being able to widen the saturated operation region of the second transistor M2.

In addition, since 0 V, the low voltage, is inputted to the first transistor M1 and the voltage VcasH higher than the voltage inputted to the fourth transistor M4 is inputted as the voltage inputted to the third transistor M3, the drain-gate voltage Vdg of the third transistor M3 can be reduced.

Therefore, the magnitude of the voltage that the third transistor M3 can withstand can be further secured relatively, thereby preventing the phenomenon of the transistor being broken down due to high voltage inputted.

Moreover, since the high voltage Vdd V is inputted to the second transistor and the low voltage VcasL is inputted to the third transistor M3, the saturated operation region of the fourth transistor M4 can be widened.

When driving the current mode logic circuit 10 in this way, it is possible to secure a margin of voltages applied to the first transistor M1 and the second transistor M2 by means of the third transistor M3 and the fourth transistor M4, and thus, the magnitude of the voltage applied to the drive voltage Vtt can also be relatively increased by that amount, resulting in an effect of being able to increase the swing width of the voltage outputted from the current mode logic circuit 10.

In other words, as compared and shown in FIG. 11, the width of the output voltage of the current mode logic circuit 10 in accordance with one embodiment can be improved to be wider than the width of the output voltage of the current mode logic circuit in accordance with the prior art.

FIG. 12 is a circuit diagram showing the configuration of a current mode logic circuit 10 in accordance with another embodiment.

Referring to FIG. 12, a current mode logic circuit 10 in accordance with another embodiment may include a first trim resistor R1 and a second trim resistor R2 connected to a supply voltage Vtt, a first transistor M1 connected to an input voltage, a second transistor M2 connected to an inverted input voltage, and a third transistor M3 and a fourth transistor M4 connected to the first transistor M1 and the second transistor M2, respectively, in a cascode manner in order to control the magnitudes of an output voltage and an inverted output voltage of the current mode logic circuit 10, the third transistor M3 may be connected to the inverted input voltage, and the fourth transistor M4 may be connected to the input voltage.

Specifically, the current mode logic circuit 10 may include a first AC coupling capacitor C1 located between the fourth transistor M4 and the input voltage and configured to AC couple the voltage inputted from the input voltage and a second AC coupling capacitor C2 located between the third transistor M3 and the inverted input voltage and configured to AC couple the voltage inputted from the inverted input voltage, and the magnitudes of the voltages inputted to the third transistor M3 and the fourth transistor M4 may be variable in conjunction with the input voltage and the inverted input voltage.

The third capacitor C3 and the fourth capacitor C4 in FIG. 12 may be implemented by capacitors that exist independently of the third transistor M3 and the fourth transistor M4 or may be implemented by parasitic capacitors of the third capacitor C3 and the fourth capacitor C4, and the values of a third resistor R3 and a fourth resistor R4 may be implemented by resistors having relatively higher resistance values than the first trim resistor R1 and the second trim resistor R2.

If AC coupling is implemented for the voltages inputted to the third transistor M3 and the fourth transistor M4 by adding capacitors C1, C2, C3, and C4, resistors R3 and R4, and a power supply Vb as shown in FIG. 12, the input voltage and the inverted input voltage can be expressed by Equations (1) and (2) as follows using a common component and a differential component Vdi_dn=Vdip−Vdin because the input voltage and the inverted input voltage have an inverse relationship with each other:

$$Vdip = Vdd/2 + (Vdi\_dn)/2 \quad \text{Equation (1):}$$

$$Vdin = Vdd/2 - (Vdi\_dn)/2 \quad \text{Equation (2):}$$

In other words, the input voltage and the inverted input voltage can be expressed using Vdd/2, the common component, and (Vdi_dn)/2, the differential component, and in general, Vdi_dn is in the high-frequency region and the input voltage Vdip and the inverted input voltage Vdin are 0 V or Vdd C, so the amplitude of Vdi_dn is equal to Vdd.

Based on the circuit shown in FIG. 12, the voltages inputted to the third transistor M3 and the fourth transistor M4 that are cascode transistors will be described. Hereinafter, the following description is made based on the voltage inputted to the fourth transistor M4, but the voltage inputted to the third transistor M3 may also be applied in the same principle.

Referring to FIG. 12, the gate voltage of the fourth transistor M4 is equal to Vb V as the first capacitor C1 is opened if the voltage inputted to the circuit is of a low frequency, but the gate voltage of the fourth transistor M4 is equal to Vdip*(C1/(C1+Cp)) V by the first capacitor C1 and the third capacitor C3 if the input voltage is of a high frequency. And since the high frequency component of Vdip can be expressed by (Vdi_dn)/2, the voltage of the fourth transistor M4 can be expressed by (Vdi_dn)/2*(C1/(C1+Cp)) V.

And if it is assumed that a voltage corresponding to a sufficiently high frequency enters as the voltage entering the input voltage Vdip, the gate voltage of the fourth transistor M4 is eventually equal to Vb+(Vdi_dn)*(C1/(C1+Cp)) V.

In addition, as the value of Vdi_dn is Vdd V when the input voltage Vdip is Vdd V and −Vdd V when it is 0 V, the gate voltage of the fourth transistor M4 is equal to Vb+(Vdd/2)*(C1/(C1+Cp)) V when Vdip=Vdd, and Vb−(Vdd/2)*(C1/(C1+Cp)) V when Vdip=0.

Therefore, if the values of Vb+(Vdd/2)*(C1/(C1+Cp)) V and Vb−(Vdd/2)*(C1/(C1+Cp)) V are adjusted, respectively, to be VcasH and VcasL described with reference to FIGS. 7 and 8, a circuit having the same function as the circuit described with reference to FIGS. 7 and 8 can be realized.

In other words, if the value of Vb and the value of the capacitance of the first capacitor C1 are set such that Vb+(Vdd/2)*(C1/(C1+Cp))=VcasH and Vb−(Vdd/2)*(C1/(C1+Cp))=VcasL, the voltages inputted to the third transistor M3 and the fourth transistor M4 may be controlled in a way of being in conjunction with the input voltage Vdip and the inverted input voltage Vdin by using the AC coupling capacitors C1 and C2.

FIG. 13 is a circuit diagram showing the configuration of a current mode logic circuit 10 in accordance with one embodiment.

Referring to FIG. 13, a current mode logic circuit 10 in accordance with one embodiment may include a first trim resistor R1 and a second trim resistor R2 connected to a supply voltage Vtt, a first transistor M1 connected to an input voltage, a second transistor M2 connected to an inverted input voltage, and a third transistor M3 and a fourth transistor M4 connected to the first transistor M1 and the second transistor M2, respectively, in a cascode manner in order to control the magnitudes of an output voltage and an inverted output voltage of the current mode logic circuit 10, and may further include a differential amplifier circuit 20 including a third trim resistor R3, a fourth trim resistor R4, a fifth transistor M5, and a sixth transistor M6, and may take the structure in which the fifth transistor M5 is connected to the input voltage, and the sixth transistor M6 is connected to the inverted input voltage.

Since the current mode logic circuit 10 in accordance with FIG. 13 applies the input voltage to the differential amplifier circuit 20 ends by being in conjunction therewith, the circuit can be driven by making the voltages inputted to the third transistor M3 and the fourth transistor M4 corresponding to the cascode transistors be in conjunction with the input voltage of the current mode logic circuit 10.

Specifically, if the input voltage Vdip is Vdd V, the inverted input voltage Vdin is 0 V, and the voltage Vca V is inputted at Vcas, then the fifth transistor M5 is opened and the sixth transistor M6 is closed, and thus, the gate voltage of the third transistor M3 is equal to Vca−(Ic*R3) V and the gate voltage of the fourth transistor M4 is equal to Vca V.

Conversely, if the input voltage Vdip is 0 V and the inverted input voltage Vdin is Vdd V, then the fifth transistor M5 is closed and the sixth transistor M6 is opened, and thus, the gate voltage of the third transistor M3 is equal to Vca V and the gate voltage of the fourth transistor M4 is equal to Vca−(Ic*R4) V.

Therefore, in the case that the input voltage Vdip is Vdd V, if the voltage inputted to the third transistor M3 and the voltage inputted to the fourth transistor M4 are adjusted to be VcasL and VcasH, respectively, the principle described above with reference to FIGS. 7 to 11 may likewise be applied. Specifically, after making the magnitudes of the resistances of the third resistor R3 and the fourth resistor R4 the same using Vca=VcasH, if the R3 and Ic values are set such that Vca−Ic*R3=VcasL by adjusting the magnitude of the current Ic flowing through the resistors, it is possible to control the gate voltages inputted to the third transistor M3 and the fourth transistor M4, which are cascode transistors.

So far, a current mode logic circuit according to the embodiment have been described in detail.

The current mode logic circuit in accordance with one embodiment can stably drive a transistor unlike the prior art even if the drive voltage of the circuit is increased, and thus, has an advantage of being able to widen the output swing width of the circuit. Accordingly, there is an effect of being able to improve the output signal and the signal-to-noise ratio (SNR) of the current mode logic circuit, thereby reducing the influence of noise and interference.

On the other hand, the constitutional elements, units, modules, components, and the like stated as "~part or portion" in the present invention may be implemented together or individually as logic devices interoperable while being individual. Descriptions of different features of modules, units or the like are intended to emphasize functional embodiments different from each other and do not necessarily mean that the embodiments should be realized by individual hardware or software components. Rather, the functions related to one or more modules or units may be performed by individual hardware or software components or integrated in common or individual hardware or software components.

A computer program (also known as a program, software, software application, script, or code) can be written in any form of programming language, including compiled or interpreted languages, declarative or procedural languages, and it can be deployed in any form, including as a standalone program or as a module, component, subroutine, object, or other unit suitable for use in a computing environment.

Additionally, the logic flows and structure block diagrams described in this patent document, which describe particular methods and/or corresponding acts in support of steps and corresponding functions in support of disclosed structural means, may also be utilized to implement corresponding software structures and algorithms, and equivalents thereof.

The processes and logic flows described in this specification can be performed by one or more programmable processors executing one or more computer programs to perform functions by operating on input data and generating output.

This written description sets forth the best mode of the present invention and provides examples to describe the present invention and to enable a person of ordinary skill in the art to make and use the present invention. This written description does not limit the present invention to the specific terms set forth.

While the present invention has been shown and described with reference to certain embodiments thereof, it will be understood by those skilled in the art that various changes in forms and details may be made therein without departing from the spirit and scope of the present invention as defined by the appended claims and their equivalents. Therefore, the technical scope of the present invention may be determined by on the technical scope of the accompanying claims.

What is claimed is:

1. A current mode logic circuit comprising:
   a first trim resistor and a second trim resistor connected to a supply voltage;
   a first transistor connected to an input voltage;
   a second transistor connected to an inverted input voltage;
   a third transistor and a fourth transistor connected to the first transistor and the second transistor, respectively, in a cascode manner in order to control magnitudes of an output voltage and an inverted output voltage of the current mode logic circuit; and
   a control unit configured to control the magnitudes of the supply voltage, the input voltage and the inverted input voltage, and voltages supplied to the third transistor and the fourth transistor of the current mode logic circuit,
   wherein the third transistor is arranged between the first trim resistor and the first transistor, and the fourth transistor is arranged between the second trim resistor and the second transistor,
   wherein the control unit is further configured to control the magnitudes of the output voltage and the inverted output voltage of the current mode logic circuit by controlling the magnitudes of the voltages supplied to the third transistor and the fourth transistor, and
   wherein the control unit is further configured to individually control the voltage supplied to the third transistor and the voltage supplied to the fourth transistor in correspondence to the magnitudes of the voltages supplied to the input voltage and the inverted input voltage.

2. The current mode logic circuit of claim 1, wherein the control unit is further configured to individually control the magnitude of the voltage supplied to the third transistor and the magnitude of the voltage supplied to the fourth transistor to be different from each other with time.

3. The current mode logic circuit of claim 2, wherein the control unit is further configured to control the magnitude of the voltage supplied to the fourth transistor to be a low voltage if the magnitude of the voltage supplied to the third transistor is a high voltage, and to control the magnitude of the voltage supplied to the fourth transistor to be a high voltage if the magnitude of the voltage supplied to the third transistor is a low voltage.

4. The current mode logic circuit of claim 1, wherein the control unit is further configured to control the magnitude of the voltage supplied to the third transistor to be smaller than the magnitude of the voltage supplied to the fourth transistor if the magnitude of the voltage supplied to the first transistor is greater than the magnitude of the voltage supplied to the second transistor.

5. The current mode logic circuit of claim 1, wherein the control unit is further configured to control the magnitude of the voltage supplied to the third transistor to be greater than the magnitude of the voltage supplied to the fourth transistor if the magnitude of the voltage supplied to the first transistor is smaller than the magnitude of the voltage supplied to the second transistor.

6. The current mode logic circuit of claim 5, wherein the control unit is further configured to input a low voltage to the third transistor and a high voltage to the fourth transistor if a voltage is inputted to the first transistor and no voltage is inputted to the second transistor.

7. The current mode logic circuit of claim 5, wherein the control unit is further configured to input a high voltage to the third transistor and a low voltage to the fourth transistor if no voltage is inputted to the first transistor and a voltage is inputted to the second transistor.

* * * * *